United States Patent
Kaneko et al.

(10) Patent No.: US 8,747,949 B2
(45) Date of Patent: Jun. 10, 2014

(54) COATING AND DEVELOPING SYSTEM, METHOD OF CONTROLLING COATING AND DEVELOPING SYSTEM AND STORAGE MEDIUM

(75) Inventors: Tomohiro Kaneko, Koshi (JP); Akira Miyata, Koshi (JP)

(73) Assignee: Tokyo Electron Limited, Tokyo-TO (JP)

( * ) Notice: Subject to any disclaimer, the term of this patent is extended or adjusted under 35 U.S.C. 154(b) by 256 days.

(21) Appl. No.: 12/902,529

(22) Filed: Oct. 12, 2010

(65) Prior Publication Data

US 2011/0029122 A1 Feb. 3, 2011

Related U.S. Application Data

(62) Division of application No. 11/734,088, filed on Apr. 11, 2007, now abandoned.

(60) Provisional application No. 60/795,648, filed on Apr. 28, 2006.

(30) Foreign Application Priority Data

Apr. 17, 2006 (JP) .................................. 2006-113331

(51) Int. Cl.
H01L 21/02 (2006.01)
H01L 21/027 (2006.01)
H01L 21/67 (2006.01)
H01L 21/673 (2006.01)
H01L 21/677 (2006.01)

(52) U.S. Cl.
USPC ...... 427/259; 427/8; 427/9; 427/58; 427/256; 427/258; 427/261; 427/282; 118/712; 118/500; 118/503; 118/66

(58) Field of Classification Search
USPC .......... 118/58, 708, 712; 427/8, 256; 414/935
See application file for complete search history.

(56) References Cited

U.S. PATENT DOCUMENTS 6,424,219 B1 7/2002 Kato
6,580,955 B2 6/2003 Lin et al.
(Continued)

FOREIGN PATENT DOCUMENTS

| JP | 9-107012 | 4/1997 | |
|----|----------|--------|---|
| JP | 10-335416 | 12/1998 | |
| JP | 2002-175052 | 6/2002 | |
| JP | 2004-260129 A | 9/2004 | |
| JP | 2005-175052 A | 6/2005 | |
| WO | WO 2004049408 A1 * | 6/2004 | ............ H01L 21/027 |

OTHER PUBLICATIONS

Office Action issued Sep. 9, 2010, in Japanese Patent Application No. 2006-113331 with English-language translation.
Japanese Office Action issued on Feb. 25, 2011 in corresponding Japanese Application No. 2006-113331 (with an English Translation).
Japanese Office Action Issued Jul. 27, 2012 in Patent Application No. 2011-124633.
Office Action issued on Jan. 20, 2012 in the corresponding Japanese Patent Application No. 2011-124633 (with english translation).

*Primary Examiner* — Robert Vetere
*Assistant Examiner* — Lisha Jiang
(74) *Attorney, Agent, or Firm* — Oblon, Spivak, McClelland, Maier & Neustadt, L.L.P.

(57) ABSTRACT

A coating and developing system includes a cassette station, a processing station and an inspection station interposed between the cassette station and the processing station. Time for which a substrate is held uselessly in the inspection module is reduced. A substrate carrying means disposed in the inspection module places priority to transferring a substrate between the cassette station and the processing station, and transfers a substrate to an inspection module in a part of a cycle time in which a substrate carrying means disposed in the processing station carries out one carrying cycle. It is permitted to carry out a substrate from the inspection module in a skip carrying mode, in which a substrate specified by a larger ordinal numeral is carried ahead of a substrate specified by a smaller ordinal numeral. It is inhibited to carry a substrate to the inspection module in the skip carrying mode.

11 Claims, 9 Drawing Sheets

(56) References Cited

U.S. PATENT DOCUMENTS

| | | |
|---|---|---|
| 6,722,798 B2 | 4/2004 | Senba et al. |
| 7,529,595 B2 | 5/2009 | Shinozuka et al. |
| 2002/0037462 A1* | 3/2002 | Ogata et al. ............... 430/30 |
| 2002/0092368 A1* | 7/2002 | Nishimura et al. .......... 73/865.8 |
| 2003/0133086 A1* | 7/2003 | Senba et al. ............... 355/27 |
| 2003/0216053 A1* | 11/2003 | Miyata ...................... 438/758 |
| 2003/0236586 A1 | 12/2003 | Tomimatsu et al. |
| 2004/0046545 A1* | 3/2004 | Akiyama et al. ........... 324/158.1 |
| 2005/0287821 A1* | 12/2005 | Higashi et al. ............. 438/780 |

* cited by examiner

FIG. 5

| CASSETTE | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 | 36 | 37 | 38 | 39 | 40 | 41 | 42 | 43 | 44 | 45 | 46 | 47 | 48 | 49 | 50 | 51 | 52 | 53 | 54 | 55 | 56 | 57 | 58 | 59 | 60 | 61 |
|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|
| TRSc | 1 | 2 | 3 | 4 | 4 | 4 | 5 | 5 | 5 | 6 | | 7 | | 8 | 8 | 8 | | | 9 | 10 | 10 | 10 | 10 | | | 12 | 13 | 13 | 14 | | 15 | | | | | | 17 | 18 | 19 | 22 | 22 | | | | | | | | | | | | | | | | | | | | |
| E1 30sec | 1 | 1 | | | 4 | 4 | 4 | 4 | 5 | 5 | 6 | 7 | 7 | 7 | 7 | 8 | 8 | | | | | | | | 11 | 11 | 11 | 12 | 12 | 14 | 14 | | 15 | 15 | 15 | | | 18 | 18 | 19 | 22 | 22 | | | | | | | | | | | | | | | | | | | |
| E2 100sec | 2 | 2 | 2 | 2 | 2 | 2 | | | 4 | 4 | 4 | 4 | 6 | 6 | 6 | | | | | | | | | | | 10 | 10 | 10 | 10 | 13 | 13 | 13 | 13 | | | | 17 | 17 | 17 | 17 | | | | | | | | | | | | | | | | | | | | | |
| E3 140sec | | | 3 | 3 | 3 | 3 | 3 | 3 | 3 | 4 | 4 | 4 | 4 | | | | | | | 8 | 8 | 8 | 9 | 9 | 9 | 9 | 9 | 9 | 10 | 10 | 10 | 10 | 10 | | | | | | | | | | | | | | | | | | | | | | | | | | | | |
| TRSd | | 1 | | | | | | 2 | 2 | 3 | 3 | | 4 | | | | | | | | | | | 8 | | | | 11 | | 9 | 12 | | 14 | 13 | 10 | 15 | | | | | | | | 18 | 17 | 19 | | 22 | | | | | | | | | | | | | |
| CASSETTE | | | 1 | | | | | | 2 | | 3 | | 5 | | 4 | 6 | 7 | | | | | | | | | | | | | 11 | 9 | 12 | | 15 | 14 | 13 | 10 | 15 | | | | | | | | 18 | 17 | 19 | | 22 | | | | | | | | | | | | |

FIG. 6

| CASSETTE | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 | 36 | 37 | 38 | 39 | 40 | 41 | 42 | 43 | 44 | 45 | 46 | 47 | 48 | 49 | 50 | 51 | 52 | 53 | 54 | 55 | 56 | 57 | 58 | 59 | 60 | 61 |
|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|
| TRSc | 1 | 2 | 3 | 4 | 5 | 4 | 5 | 5 | 5 | 6 | 5 | 7 | 7 | 7 | 7 | | | 8 | 9 | 8 | 9 | 10 | 10 | 10 | 10 | 10 | 10 | 11 | | 12 | 12 | 12 | 12 | 12 | 12 | 12 | 12 | 12 | | | 13 | | 14 | 15 | 15 | 15 | | | 17 | 18 | 19 | 19 | 19 | 19 | | 22 | | | | | |
| E1 30sec | 1 | | 1 | | 2 | 2 | 2 | | | | | | | | | | 7 | | | | 8 | | | | | | | | 11 | 11 | 11 | 11 | 11 | 11 | 11 | 11 | 11 | 11 | 12 | | | | 14 | 14 | 15 | | | | 18 | 18 | 19 | 18 | 18 | 19 | 19 | | 22 | 22 | | | |
| E2 100sec | | 2 | 2 | | 2 | 2 | 3 | 3 | 4 | 5 | 5 | 6 | 6 | 6 | 6 | 7 | 7 | | | | 9 | 9 | 9 | 9 | 9 | 9 | 9 | 10 | 10 | 10 | 10 | 10 | 10 | 10 | 10 | 10 | | | 12 | | | 13 | 13 | 13 | | | | 17 | 17 | 17 | 17 | | | | | | | | | |
| E3 140sec | | 3 | 3 | | 3 | 3 | 3 | 4 | 4 | 4 | 4 | 4 | 4 | 4 | 4 | 6 | 6 | | | | | 8 | 8 | 8 | 8 | 8 | 8 | 8 | | 9 | 9 | 9 | 9 | 9 | 9 | | | | | | | | | | | | | | | | | | | | | | | | | | |
| TRSd | 1 | | 1 | | | 2 | 2 | 3 | 3 | 4 | 4 | 4 | 4 | 4 | 4 | 5 | 6 | | | | | | | | | | | 8 | | | | | | | | | | | | 10 | 11 | 12 | | | | 13 | 14 | 15 | 15 | | | | | | 19 | 19 | | 22 | | 22 |
| CASSETTE | 1 | | 1 | | | | | 2 | 2 | 3 | 3 | 4 | 4 | 4 | 4 | 4 | 5 | 6 | 7 | | | | | | | | | | | | | | | | | | | | | 10 | 11 | 12 | | | | | | 16 | | | | | 17 | 18 | 19 | | | | | 22 |

COATING AND DEVELOPING SYSTEM, METHOD OF CONTROLLING COATING AND DEVELOPING SYSTEM AND STORAGE MEDIUM

CROSS REFERENCE TO RELATED APPLICATIONS

This application is a division of and is based upon and claims the benefit of priority under 35 U.S.C. §120 for U.S. Ser. No. 11/734,088, filed Apr. 11, 2007, and the benefit of priority under 35 U.S.C. §119(e) for U.S. Provisional Application No. 60/795,648, filed on Apr. 28, 2006, and claims the benefit of priority under 35 U.S.C. §119 from Japanese Patent Application No. 2006-113331, filed Apr. 17, 2006, the entire contents of each of which are incorporated herein by reference.

BACKGROUND OF THE INVENTION

1. Field of the Invention

The present invention relates to a coating and developing system for processing substrates, such as semiconductor wafers or LCD substrates (glass substrates for liquid crystal displays) by a cleaning process, a coating process for coating the substrate with a liquid resist and a developing process for processing the substrate processed by an exposure process, and to a coating and developing method.

2. Description of the Related Art

A system built by connecting an exposure system to a coating and developing system carries out a series of processes for forming a desired resist pattern on a substrate, such as a substrate on which a semiconductor device is to be fabricated or an LCD substrate, by applying a liquid resist to a surface of the substrate in a resist film, exposing the resist film through a photomask and developing the exposed resist film.

The coating and developing system includes a cassette station provided with a cassette table for supporting a wafer cassette and a transfer device which takes out a semiconductor wafer (hereinafter, referred to simply as "wafer") from and puts a wafer into the cassette, a processing station for processing the wafer by resist film forming processes and a developing process, and an interface station connected to an exposure system. The cassette station, the processing station and the interface station are arranged in a row in that order.

After the resist pattern has been formed, the wafer is inspected by a predetermined inspection procedure for measuring the width of lines forming the resist pattern, examining the alignment of the resist pattern with a pattern underlying the resist pattern and finding defects caused by development. Only acceptable wafers are transferred to the next process. In most cases, the inspection is carried out by a stand-alone inspection system separate from the coating and developing system. However, inspection using an in-line inspection system included in the coating and developing system is more convenient than inspection using the stand-alone inspection system.

A substrate processing system proposed in JP-A 2005-175052 (Paragraph 0042 and FIG. 4) includes a cassette station, a processing station, and an inspection station including a plurality of inspection devices and carrying devices and interposed between the cassette station and the processing station. The processing system mentioned in JP-A 2005-175052 carries a substrate from the cassette station through the inspection station to the processing station, returns the completely processed substrate temporarily to a cassette placed in the cassette station, and then carries the processed substrate from the cassette to the inspection station to inspect the processed substrate.

FIG. 9 is a schematic plan view of a coating and developing system concretely realizing this previously proposed processing system. Shown in FIG. 9 are a cassette station 11, an inspection station 12, a processing station 13, and an interface station 14 connected to an exposure system. Shown also in FIG. 9 are wafer cassettes C, a transfer device 15 placed in the cassette station 11, a carrying device 16 placed in the inspection station 12, transfer modules TRSa, TRSb, TRSc and TRSd, and inspection modules E1, E2 and E3. Although the transfer modules TRSa, TRSb, TRSc and TRSd, and the inspection modules E1, E2 and E3 are shown in a planar arrangement for convenience, actually, the transfer modules TRSa, TRSb, TRSc and TRSd are stacked in four layers, and the inspection modules E1, E2 and E3 are stacked in three layers.

In the coating and developing system shown in FIG. 9, a wafer is carried from the cassette C through the transfer device 15, the transfer module TRSa and the carrying device 16 in that order to the processing station 13. Processing modules installed in the processing station process the wafer by processes for coating a surface of the wafer with a resist film. The wafer having the surface coated with the resist film is delivered through the interface station 14 to the exposure system. After the wafer has been processed by the exposure system, the wafer is returned to the processing station. The processing modules of the processing station 13 process the wafer by developing processes. Then the wafer is returned through the carrying device 16, the transfer module TRSb and the transfer device 15 in that order to the cassette C.

Wafers contained in the cassette C are processed in predetermined order. For example, ordinal numerals first to thirteenth are assigned respectively to thirteen wafers contained in the cassette C. The wafers are carried in numerical order to the processing station 13. The wafers are carried successively to the modules in predetermined order. The carrying device, namely, the main carrying device, of the processing station 13 performs a cyclic carrying operation to carry the wafers cyclically in a cyclic carrying mode through a series of the modules in predetermined order. Thus the wafers are carried successively in the predetermined order through the series of the modules. The main carrying device has two arms for replacing the wafer held in the module with other one. Suppose that a carrying route to be followed by the main carrying device is a circulation route. Then, the carrying device travels once through the circulation route in a predetermined cycle time. The carrying device does not travel back and does not carry wafers in a skip carrying mode, in which the wafer specified by a larger ordinal numeral, namely, the wafer taken out later from the cassette C, is carried ahead of the wafer specified by a smaller ordinal numeral, namely, the wafer taken out earlier from the cassette C. The carrying device operates in such a carrying mode because an impractical, complicated carrying program is necessary for controlling the carrying device unless the carrying device operates in such a carrying mode.

All the wafers returned to the cassette C or chosen ones of the wafers returned to the cassette C are delivered to the transfer module TRSc. The carrying device 16 carries the wafers from the transfer module TRSc to the inspection module. Some of the wafers are inspected only by the inspection module E1, E2 or E3 and some other wafers are inspected successively by the inspection modules E2 and E3. The carrying device 16 carries the wafers in the inspection station 12 in a cyclic carrying mode similar to that in which the main carrying device carries the wafers in the processing station 13.

The carrying device 16 operates in the cyclic carrying mode in synchronism with the cyclic carrying operation of the main carrying device.

The wafer delivered to the transfer module TRSa needs to be held in the transfer module TRSa until the main carrying device comes to a transfer module, not shown, in the processing station 13 to receive the wafer, because the main carrying device advances without receiving any wafer from the transfer module and the carrying of the wafer is delayed by one carrying cycle. Therefore, the carrying device 16 working in the inspection station 12 needs to give the highest priority to carrying wafers between the transfer modules TRSa and TRSb, and the processing station 13. Under such a condition, the carrying device 16 performs the cyclic carrying operation to carry a wafer through the transfer module TRSc, the inspection modules E1, E2 and E3 and the transfer module TRSd in that order after completing carrying a wafer to the transfer module TRSa or TRSb. For example, if the inspection operations for inspecting wafers by the inspection modules E1 and E2 are accomplished simultaneously, one of the wafers is held in the inspection module E1 (or E2) for a time corresponding to one carrying cycle.

Consequently, the throughput of the inspection station 12 decreases. The inventors of the present invention made studies to operate the carrying device 16 asynchronously with the main carrying device. When the carrying device 16 operates asynchronously with the main carrying device, the carrying device 16 performs preferentially a carrying operation for delivering a wafer to the processing station or a carrying operation for receiving a wafer from the processing station when a ready signal is provided by the transfer module TRSa or when a ready signal is provided after a processed wafer has been delivered to the transfer module of the processing station 13. The carrying device 16 can use whole of the rest of the time for transferring a wafer to and receiving the wafer from one of the inspection modules E1, E2 and E3.

However the following problems arise when the carrying device 16 operates in such a mode. Suppose that the coating and developing system is required to process 150 wafers every hour, the transfer device 15 takes 8 s to complete the transfer operation once and the carrying device 16 takes 5 s to complete the carrying operation once. Then, the cycle time of the cyclic carrying operation should not be longer than 24 s (=3600 s/150) to process 1500 wafers every hour. Consequently, the transfer device 15 can accomplish the carrying operation only three times (24/8=3) during one carrying cycle and the carrying device 16 can accomplish the carrying operation only four times (20/5=4) during one carrying cycle.

As mentioned above, wafers need to be carried preferentially to the transfer modules TRSa and TRSb. Therefore, the transfer arm 15 can accomplish the transfer operation with the transfer modules TRSc and TRSd once during one carrying cycle. The carrying dev ice 16 can accomplish the carrying operation with the inspection module E1 (E2, E3) twice during one carrying cycle. The inspection modules E1, E2 and E3 carry out different inspections, respectively, and the different inspections take different inspection times, respectively. Suppose that the inspection Modules E1, E2 and E3 need inspection times of 30 s, 100 s and 140 s, respectively, and the 11th wafer, the 10th wafer and the 9th wafer are held in the inspection modules E1, E2 and E3, respectively. The 11th wafer cannot be taken out from the inspection module E1 unless the inspection of the 9th wafer is completed before the completion of the inspection of the 11th wafer.

For example, it is possible that the first wafer of the succeeding lot is delivered to the inspection module E3 first, and then the last wafer of the preceding lot is delivered to the inspection module E3 if carrying wafers in the skip carrying mode, in which a wafer specified by a larger ordinal numeral is carried ahead of a wafer specified by a smaller ordinal numeral, is permitted in the inspection station. Consequently, a recipe for an inspection to be carried out by the inspection module E3 needs to be changed and wafers cannot be smoothly carried.

If a wafer cannot be taken out from the inspection module after the completion of inspection, an inspection process takes a long time, which will be explained in connection with the description of a comparative example.

SUMMARY OF THE INVENTION

The present invention has been made under such circumstances and it is therefore an object of the present invention to provide a technique capable of reducing time for which a substrate is held unnecessarily in an inspection module to improve the throughput of a coating and developing system.

A coating and developing system in a first aspect of the present invention includes: a cassette station for holding cassettes each containing a plurality of substrates, provided with a transfer means for taking out the substrate from and returning the substrate to the cassette; a processing station provided with a plurality of processing modules for carrying out a process for forming a resist film on a surface of the substrate taken out from the cassette, a process for developing the resist film after exposure and processes to be carried out respectively before and after the process for developing the resist film, and a first substrate carrying means for carrying the substrate on a circulation route in a predetermined cycle time to carry the substrate to the processing modules; an inspection station provided with a plurality of inspection modules for inspecting the processed substrate by different inspections requiring different inspection times, respectively, and a second substrate carrying means for transferring the wafer between the cassette station and the processing station and carrying the substrate to and from the inspection module; and a controller for controlling the second substrate carrying means; wherein the controller controls the second substrate carrying means such that a) priority is given to transferring the substrate between the cassette station and the processing station and receiving the substrate from the processing station, b) substrates are carried to the inspection modules in order of ordinal numerals indicating processing order and assigned to the substrates, respectively, and c) the substrates which have been inspected are carried out from the inspection modules regardless of the ordinal numerals indicating processing order and assigned to the substrates, respectively.

The coating and developing system according to the present invention may further include first and second transfer modules for transferring the substrate between the transfer means of the cassette station and the second substrate carrying means; wherein the controller may control the transfer means of the cassette station so that the substrate processed in the processing station is transferred to the cassette, the substrate taken out from the cassette is transferred to the first transfer module, and the inspected substrate is transferred through the second transfer module to the cassette.

In the coating and developing system according to the present invention, the controller may control the transfer means of the cassette station so as to take out the processed substrate processed in the processing station from the cassette and to transfer the same substrate to the first transfer module or so as to take out a substrate from a cassette delivered for inspection from outside the coating and developing system and to transfer the same substrate to the first transfer module.

The transfer means of the cassette station can transfer the substrate to either of the first and the second transfer module only once in the cycle time.

Preferably, the controller controls the second substrate carrying means such that the substrate is transferred to the inspection module within a time remaining after subtracting a carrying time in which the substrate is carried from the cassette station and a carrying time in which the substrate is received from the processing station from the cycle time when the substrate is transferred from the cassette station to a processing module of the processing station, such as a cooling module. If the cycle time terminates at a time point $T_0$ after a time point when the substrate is carried from the cassette station to the processing module when the second carrying means is controlled in such a mode, the transfer of the substrate to the inspection module by the second carrying means is suspended if it is expected that a time point when the succeeding substrate is carried from the cassette station to the processing module will be behind the time point $T_0$ if the second carrying means carries the preceding substrate to the inspection module.

A coating and developing system control method in a second aspect of the present invention for controlling a coating and developing system including: a cassette station for holding cassettes each containing a plurality of substrates, provided with a transfer means for taking out the substrate from and returning the substrate to the cassette; a processing station provided with a plurality of processing modules for carrying out a process for forming a resist film on a surface of the substrate taken out from the cassette, a process for developing the resist film and processes to be carried out before and after the process for developing the resist film, and a first substrate carrying means for carrying the substrate on a circulation route in a predetermined cycle time; and an inspection station provided with a plurality of inspection modules for inspecting the processed substrate by different inspections requiring different inspection times, respectively, and a second substrate carrying means for transferring the wafer between the cassette station and the processing station and carrying the substrate to and from the inspection module; includes the steps of; making the second substrate carrying means carry the substrate preferentially when a ready signal indicating the completion of preparation for carrying the substrate to the processing station is provided by the cassette station or a ready signal indicating the completion of preparation for carrying the substrate to a desired destination is provided by the processing station; carrying the substrates to the inspection modules in order of ordinal numerals assigned to the substrates; and carrying out the inspected substrates from the inspection modules regardless of the order of the ordinal numerals assigned to the substrates.

A storage medium in a third aspect of the present invention stores a computer program including directions for accomplishing the method according to the present invention.

According to the present invention, the substrates can be carried out in the order of the ordinal numerals assigned to the substrates; that is, the substrates can be carried out from the inspection modules regardless of the order of the ordinal numerals assigned to the substrates. Time for which the processed substrate is held uselessly by the inspection module can be reduced and hence the throughput of the coating and developing system can be improved. Since the delivery of the substrates to the inspection modules regardless of the predetermined order is forbidden, there will not arise the problem of changing recipes for inspections to be carried out by the inspection modules needed when the first substrate of the succeeding lot is delivered to the inspection module and the last substrate of the preceding lot is delivered to the inspection module.

BRIEF DESCRIPTION OF THE DRAWINGS

FIG. 5 is a diagram of assistance in explaining the simulation of a carrying schedule, showing movement of substrates in an inspection station included in the coating and developing system in the preferred embodiment;

FIG. 6 is a diagram of assistance in explaining the simulation of a carrying schedule, showing movement of substrates in an inspection station included in a coating and developing system in a comparative example;

DESCRIPTION OF THE PREFERRED EMBODIMENTS

Figure 1:
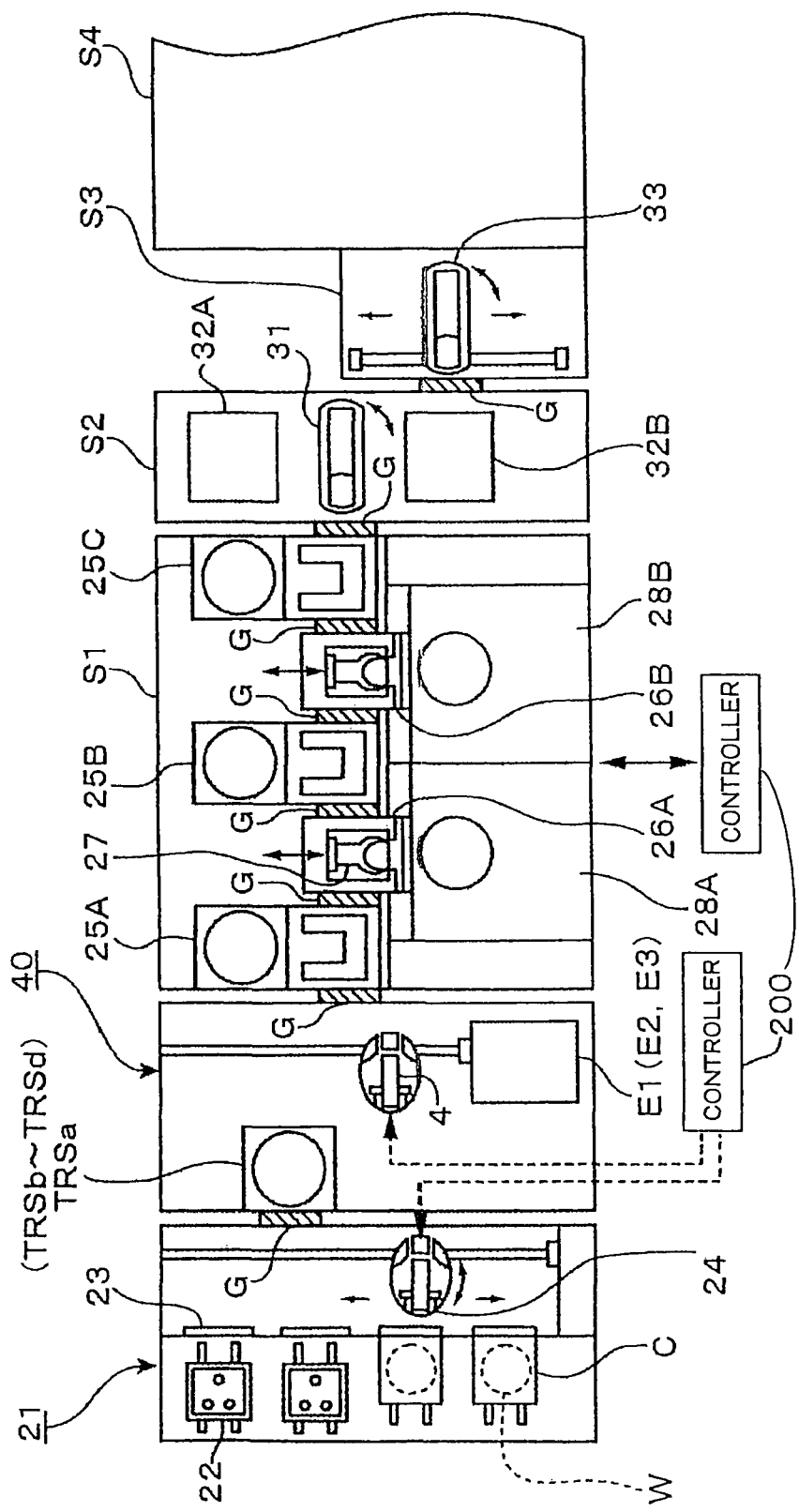
FIG. 1 is a plan view of a coating and developing system in a preferred embodiment according to the present invention.
Figure 2:
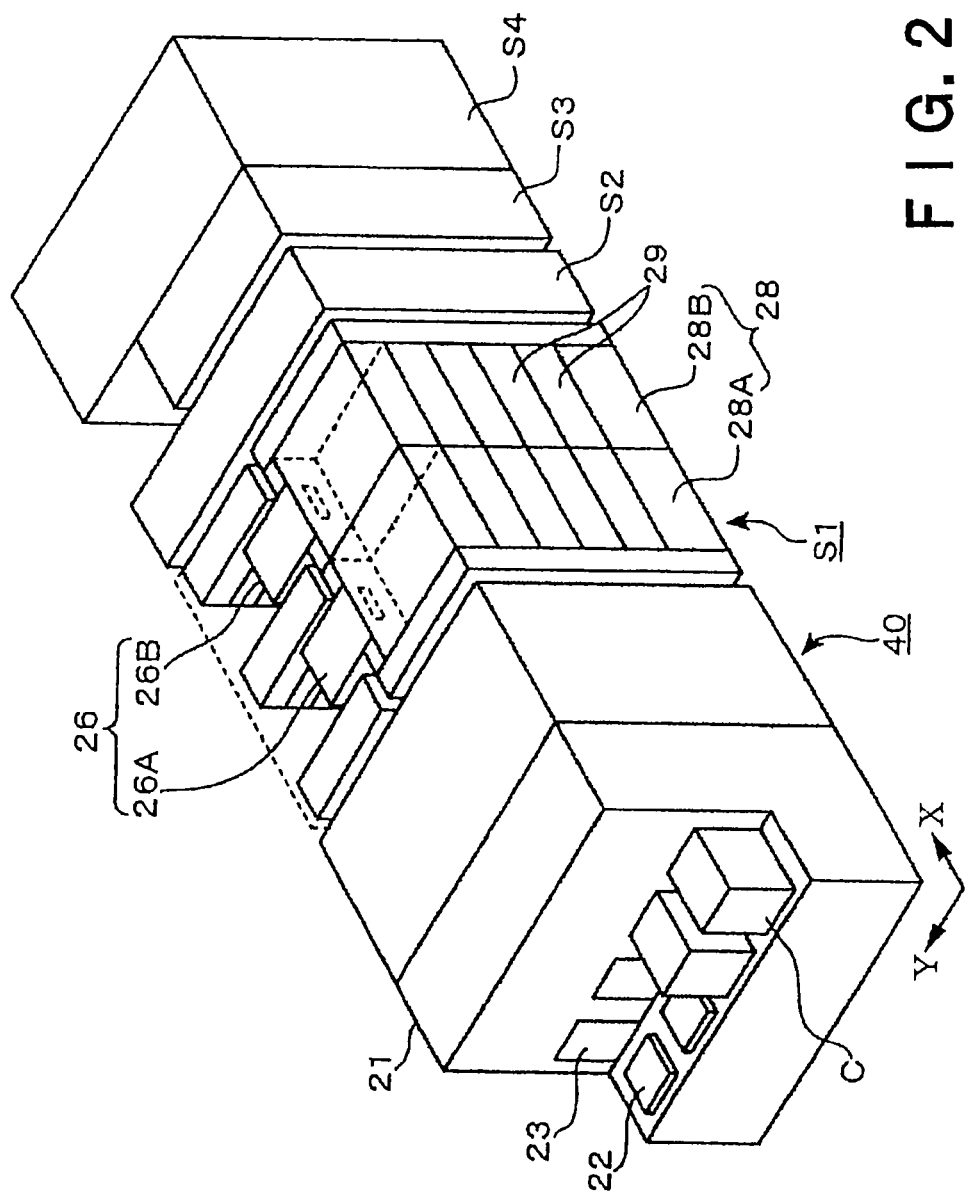
FIG. 2 is a schematic perspective view of the coating and developing system in the preferred embodiment.

An outline of a coating and developing system in a preferred embodiment according to the present invention will be described with reference to a plan view and a perspective view respectively shown in FIGS. 1 and 2. Referring to FIGS. 1 and 2, a cassette C containing, for example, thirteen 12 in. diameter wafers W, namely, substrates, in an airtight fashion is delivered to and sent out from a cassette station 21. The cassette station 21 is provided with cassette tables 22 on which the cassette C is supported, a wall disposed behind the cassette tables 22 and provided with closable openings 23, and a transfer device 24, namely, transfer means, for taking out the wafers W from the cassette C through the closable opening 23. The transfer device 24 has an arm movable in vertical, transverse and longitudinal directions and turnable abut a vertical axis. The transfer device 24 is controlled by instructions provided by a controller 200, which will be described later.

An inspection station 40 and a processing station S1 surrounded by boxes, respectively, are arranged contiguously in that order behind the cassette station 21.

Figure 3:
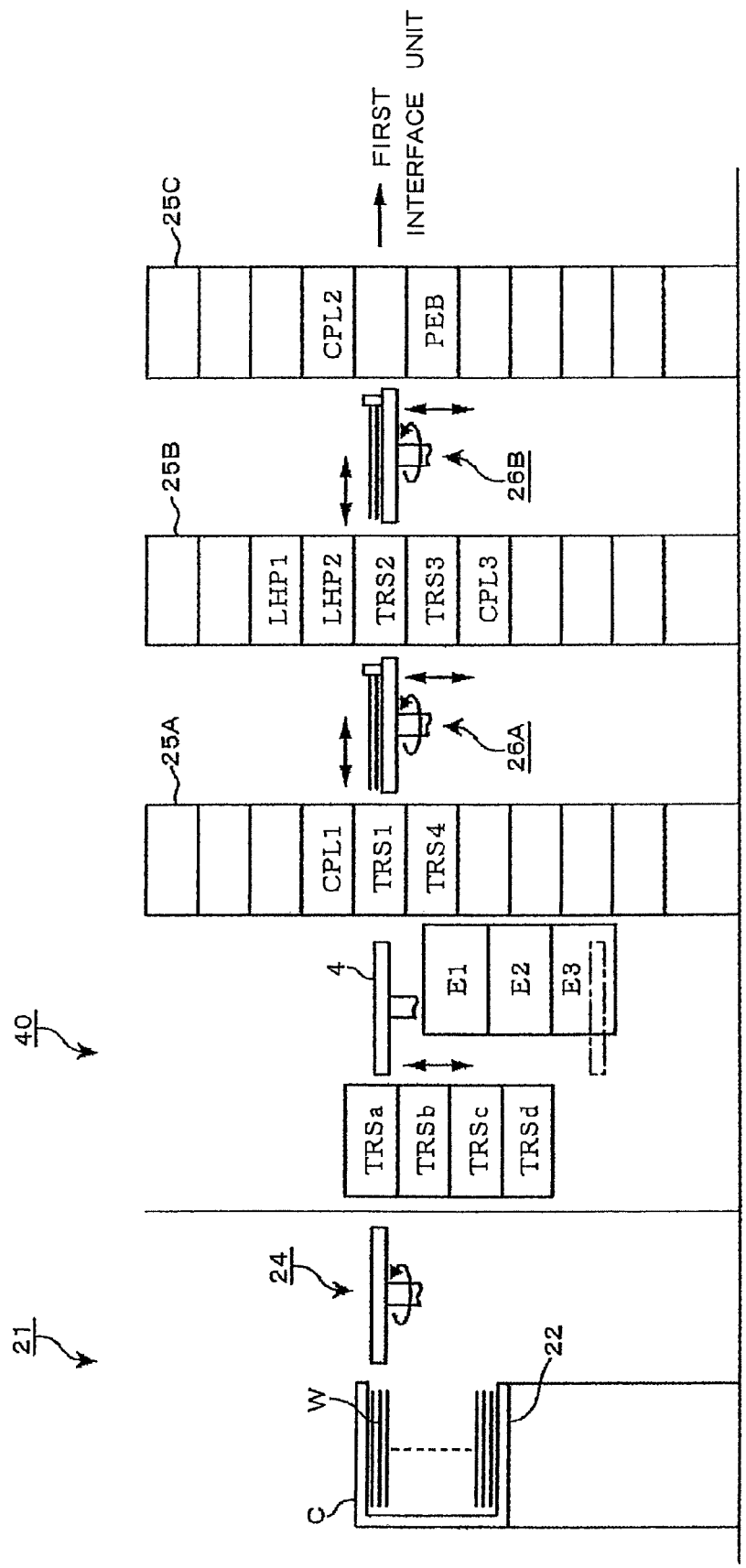
FIG. 3 is a schematic side elevation of the coating and the developing system in the preferred embodiment.

The inspection station 40 is provided with four transfer modules TRSa to TRSd, inspection modules E1 to E3, and a carrying device 4, namely, a second substrate carrying means, for carrying a wafer W to and from the modules TRSa to TRSd and E1 to E3 and transfer modules TRS1 and TRS2, which will be described later. As shown in FIG. 3, the transfer modules TRSa to TRSd are stacked vertically. The inspection modules E1 to E3 are stacked vertically. The inspection station 40 will be described later. First the processing station S1 will be described.

The processing station S1 includes three shelf modules 25 (25A, 25B and 25C) arranged backward in that order, wet processing units, two main carrying devices 26A and 26B, namely, first substrate carrying means, for transferring a wafer W among wet processing modules, which will be described later. Each of the shelf modules 25 is built by stacking modules of a heating and cooling system in layers. The shelf modules 25A, 25B and 25C and the main carrying devices 26A and 26B are arranged alternately. Each of the main carrying devices 26 (26A and 26B) is provided with two arms 27. The arms 27 are movable in vertical, transverse and longitudinal directions and are turnable about a vertical axis. The main carrying devices 26A and 26B are controlled by instructions provided by the controller 200.

The shelf modules 25 (25A, 25B and 25C) and the main carrying devices 26A and 26B arranged longitudinally in a row. Passageways, not shown, are formed in the joints G of the adjacent ones of the shelf modules 25A, 25B and 25C and the main carrying devices 26A and 26B. Thus the wafer W can be freely moved from the shelf module 25A to the shelf module 25C in the processing station S1. The main carrying devices 26A and 26B are disposed in a space defined by a partition wall on the side of the shelf modules 25 (25A, 25B and 25C), a partition wall on the side of a wet processing unit, i.e., on the right-hand side, and a left-hand partition wall.

Wet processing modules 28 (28A and 28B) are disposed such that the main carrying devices 25 (25A and 25B) can carry a wafer W to and receiving a wafer from the wet processing modules 28 (28A and 28B). The wet processing modules 28 (28A and 28B) are built by stacking wet processing devices including coating devices and developing devices in layers. As shown in FIG. 2 by way of example, processing vessels 29 holding a coating device 4A and such are stacked in, for example, five layers in the wet processing modules 28 (28A and 28B).

As shown in FIG. 3 by way of example, transfer modules TRS1 to TRS4 for transferring wafers, heating modules LHP1 and LHP2, namely, heating devices, for processing a wafer wetted with a liquid resist or a developer by a heating process, cooling modules CPL1, CPL 2 and CPL3, namely, cooling devices, for processing a wafer by a cooling process before and after applying a liquid resist to the wafer or before subjecting the wafer to a developing process, a heating module PEB, namely, a heating device, for processing a wafer processed by an exposure process by a heating process and such are stacked vertically in, for example, ten layers to build the shelf modules 25 (25A, 25B and 25C). The transfer modules TRS1 and TRS4 are used for transferring a wafer between the cassette station 21 and the processing station S1. The transfer modules TRS2 and TRS3 are used for transferring a wafer between the two main carrying devices 26A and 26B.

In this embodiment, the heating modules LHP1 and LHP2, the cooling modules CPL1, CPL 2 and CPL3, and the heating module PEB are processing modules.

A first interface unit S2 and a second interface unit S3 are arranged in that order behind the shelf module 25C of the processing station S1, and an exposure system S4 is connected to the second interface unit S3. The first interface unit S2 is provided with a transfer device 31 capable of moving in vertical directions and of turning about a vertical axis, and shelf modules 32A and 32B. The transfer device 31 carries a wafer to and receives a wafer from CPL 2 and the PEB of the shelf module 25C of the processing station S1. The shelf module 32A is built by stacking in-buffer cassettes for temporarily holding wafers to be delivered to an edge exposure system and the exposure system S4, and out-buffer cassettes for temporarily holding wafers delivered thereto from the exposure system S4 in layers. The shelf module 32B is built by stacking transfer modules and precision temperature regulating modules in layers.

The second interface unit S3 is provided with a transfer device 33. The transfer device 33 carries wafers to and receives wafers from the transfer modules and the precision temperature regulating modules of the first interface unit S2, and an in-stage and an out-stage included in the exposure system S4.

Figure 4:
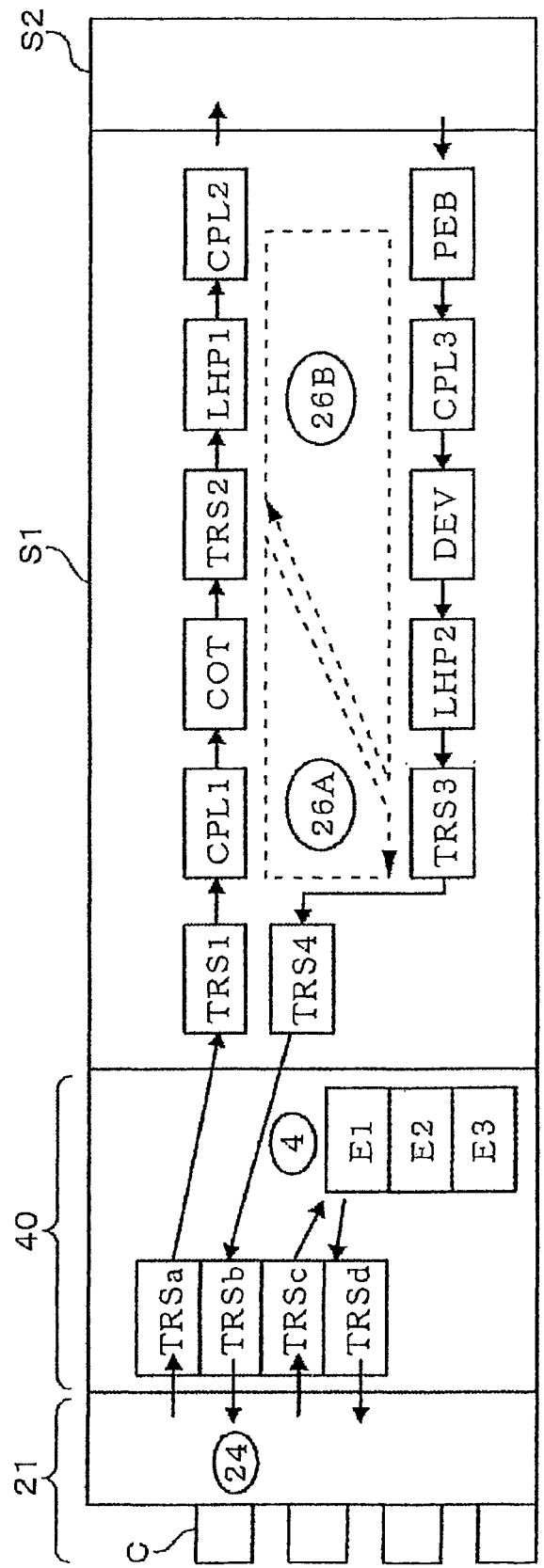
FIG. 4 is a diagrammatic view of assistance in explaining the flow of a substrate in the coating and developing system in the preferred embodiment.

Operations of the main carrying devices 26A and 26B in the processing station S1 will be described. As shown in FIG. 4 by way of example, the two main carrying devices 26A and 26B carry a wafer from the cassette station 21 through the TRS1, the CPL1, a coating device (COT), the TRS2, the LHP1 and the CPL2 in that order toward the first interface unit S2. The two main carrying devices 26A and 26B carry a wafer from the first interface unit S2 through the PEB, the CPL3, a developing device (DEV), the LHP2, the TRS3 and the TRS4 in that order toward the cassette station 21. A wafer is transferred through the CPL2 and the PEB between the processing station S1 and the first interface unit S2.

Passages on which the main carrying devices 26A and 26B travel are indicated by dotted lines in FIG. 4. In this embodiment, the main carrying device 26A carries a wafer in a cyclic carrying mode on a circulation route sequentially passing the TRS1, the CPL1, the COT, the TRS2, the TRS3, the TRS4 and the TRS1. The main carrying device 26B carries a wafer in a cyclic carrying mode on a circulation route sequentially passing the TRS2, the LH01, THE CPL2, THE PEB, the CPL3, the DEV, the LHP2, the TRS3 and the TRS2. Therefore, as shown in FIG. 3 by way of example, the TRS1 and the TRS4 are included in the shelf module 25A, the TRS2 and the TRS3 are included in the shelf module 25B, the CPL2 and the PEB are included in the shelf module 25C, the CPL1 is included in the shelf module 25A or 25B, and the LH01 and the LHP2 are included in the shelf module 25B or 25C. Each of the main carrying devices 26A and 26B is provided with two arms to take out a wafer W from the processing module and to deliver a wafer W to the same processing module. The main carrying devices 26A and 26B transfer a wafer W successively to the modules according to a predetermined carrying schedules specifying order in which a wafer W is delivered sequentially to the modules. Wafers W are carried successively on the carrying route, and wafers are not carried in the skip carrying mode, in which a wafer specified by a larger ordinal numeral indicating processing order is not carried ahead of a wafer specified by a smaller ordinal numeral. For example, when a wafer W is carried to the heating module and the cooling module in that order, a wafer specified by a larger ordinal numeral is never carried to the heating module ahead of a wafer specified by a smaller ordinal numeral.

The flow of a wafer W to be processed in the processing station S1 will be explained. A cassette C containing wafers W is delivered from an external system to the cassette station 21. Then, the lid of the cassette C is removed and the closable opening 23 is opened. Then, the transfer device 24 takes out a wafer W from the cassette C. The transfer device 24 transfers the wafer W to the transfer module TRSa. Then, as shown in FIGS. 3 and 4, the carrying device 4 of the inspection station 40 carries the wafer W to the transfer module TRS1. Then, the main carrying device 26A receives the wafer W from the transfer module TRS1. Then, as mentioned above, the main carrying devices 26A and 26B carry the wafer W on the route sequentially passing the TRS1, the CPL1, the COT, the TRS2, the LHP1 and the CPL 2. The wafer W to which a liquid resist has bee applied is sent from the CPL 2 to the first interface unit S2.

In the first interface unit S2, the transfer device 31 carries the wafer in order of the in-buffer cassette, the edge exposure system and the precision temperature regulating module. The wafer W is transferred from the transfer module of the shelf module 32B to the second interface unit S3. Then, the carrying device 33 of the second interface unit S3 delivers the wafer W to the receiving stage of the exposure system S4. The exposure system S4 processes the wafer W by an exposure process.

The wafer W processed by the exposure process is carried through the second interface unit S3 and the first interface unit S2 to the PEB of the processing station S1. Then, the wafer W is carried, as mentioned above, on the route sequentially passing the PEB, the CPL3, the DEV, THE LHP2, the TRS3 and the TRS4. The developing device processes the wafer W by a predetermined developing process to form a desired resist pattern on the wafer W.

The main carrying device 26A carries the nth wafer $W_n$ through the TRS1 to the CPL1 for the next process. Then, the main carrying device 26A carries the wafer W in a cyclic carrying mode on a route sequentially passing the COT, the TRS2, the TRS3, the TRS4 and the TRS1 in one carrying cycle and returns to the TRS1. Subsequently, the main carrying device 26A carries the (n+1)th wafer $W_{n+1}$ through the TRS1 to the CPL1. The main carrying device 26B carries the wafer W from the TRS2 to the LHP1 for the next process. Then, the main carrying device 26B carries the wafer W in a cyclic carrying mode on a route sequentially passing the CPL2, the PEB, the CPL3, the DEV, the LHP2, the TRS3 and the TRS2 in one carrying cycle and returns to the TRS2. Subsequently, the main carrying device 26B carries the next wafer W through the TRS2 to the LHP1. As mentioned above in the description of the related art, a set cycle time for this coating and the developing system is 24 s when the coating and developing system is required to process 150 wafers W every hour.

The inspection station 40 will be described with reference to FIG. 4. The transfer module TRSa holds a wafer W taken out from the cassette C and to be delivered to the processing station S1. The transfer module TRSb holds a processed wafer W returned from the processing station S1. The transfer module TRSc holds a processed wafer W returned from the processing station S1 and received from the cassette C holding processed wafers W until the processed wafer W is delivered to the inspection module E1 (E2, E3). The transfer module TRSd holds a wafer W inspected by the inspection module E1 (E2, E3). The transfer modules TRSa to TRSd are stacked vertically in layers. The inspection modules E1, E2 and E3 are stacked vertically in layers. In FIG. 4, the transfer modules TRSa to TRSd and the inspection modules E1, E2 and E3 shown in a planar arrangement for convenience.

The carrying device 4 is controlled such that a) priority is given to transferring the wafer W between the cassette station 21 and the processing station S1.

Theoretically, a carrying operation for carrying a wafer W between the transfer modules TRSc and TRSd, and the inspection module E1 (E2, E3) can be accomplished only twice during one carrying cycle, i.e., in the cycle time, when the cycle time is 24 s and the carrying device 4 accomplishes one carrying operation in 5 s. Actually, in some cases, a carrying operation for carrying a wafer W between the transfer modules TRSc and TRSd, and the inspection module E1 (E2, E3) can be accomplished more than twice in one carrying cycle. For example, suppose that a preceding wafer W held by the transfer module TRS1 is taken out by the main carrying device 26A and a first succeeding wafer W is carried from the transfer module TRS1 to the transfer module TRS1 by the carrying device 4. Then the main carrying device 26A takes out the first succeeding wafer W from the transfer module TRS1 after the cycle time has elapsed. A second succeeding wafer W may be delivered to the empty transfer module TRS1 at a time point when another cycle time terminates; that is, a time point before the main carrying device 26A accesses the transfer module TRS1 for the next carrying cycle. Thus, in some cases, the carrying operation for carrying a wafer W between the transfer module TRSc and the inspection module E1 (E2, E3) and between the transfer module TRSd and the inspection module E1 (E2, E3) can be accomplished three times in some carrying cycle. The carrying operation can be accomplished three times in a carrying cycle, for example, when a transfer operation for transferring a wafer W to the inspection module is started immediately before the termination of the cycle time and the transfer of a wafer W from the transfer module TRSa to the transfer module TRS1 becomes possible immediately after the termination of the cycle time.

When the transfer module TRS1 functions also as a processing module, such a carrying mode is not permitted and the repetition of the carrying operation in one carrying cycle is necessarily twice, which will be described later.

The carrying device 4 is controlled such that b) wafers W are carried to the inspection module E1 (E2, E3) in order of ordinal numerals indicating a processing sequence respectively assigned to the wafers W, and c) the wafers W which have been inspected are carried out from the inspection modules E1 (E2, E3) regardless of the ordinal numerals indicating the processing sequence and assigned to the wafers W, respectively. Thus the first to the thirteenth wafer W are transferred in that order from the transfer module TRSc to the inspection module E1 (E2, E3). For example, suppose that processing the eleventh wafer W has been completed, while processing the ninth wafer W has not yet been completed. Then, the eleventh wafer W is carried out from the inspection module E1 (E2, E3) before carrying out the ninth wafer W from the inspection module E1 (E2, E3).

In this embodiment, the inspection module E1 is a macro-inspection module that inspects wafers W for macro defects, the inspection module E2 is a dimension measuring module that measures the thickness of a film and the width of lines forming a pattern, and the inspection module E3 is an alignment inspecting module that inspects a wafer W for the alignment of a mask used by the exposure process to form a pattern in the resist film formed on a wafer W with a pattern previously formed on the wafer W, i.e., the alignment of a pattern formed in the resist film formed on a wafer W with a pattern underlying the pattern formed in the resist film. The inspection modules E1, E2 and E3 take inspection times of for example, 30 s, 100 s and 140 s, respectively. Since the inspection modules E1, E2 and E3 take the different inspection times, respectively, for inspection, the inspection of the wafer W specified by a larger ordinal numeral is completed before the completion of inspecting the wafer W specified by a smaller ordinal numeral in some cases.

The transfer device 24 of the cassette station 21 performs operations for a) transferring an unprocessed wafer W from the cassette C to the transfer module TRSa, b) receiving a processed wafer W from the transfer module TRSb and returning the same to the cassette C, c) transferring a processed wafer W from the cassette C to the transfer module TRSc and d) receives an inspected wafer W from the transfer module TRSd and returns the same to the cassette C. The carrying operations for a) and b) needs to be always completed within the cycle time. Therefore, if the cycle time is 24 and one carrying operation takes 8 s, only the operation for either of c) and d) can be accomplished in one carrying cycle.

This system is provided with the controller 200 including a computer. The operations of the transfer deice 24 and the carrying device 4 and series of processes are controlled by a computer program stored in a storage device included in the controller 200. A ready signal indicating that the transfer module is ready is provided when a wafer W is placed on a stage included in the transfer module or when a wafer W is sent out from the transfer module. A ready signal indicating that the inspection module is ready is provided when the inspection of a wafer W is completed or when a wafer W is sent out from the inspection module. More concretely, for example, a signal provided upon the placement of a wafer W on a stage included in the transfer module TRSa is a ready for transfer signal indicating that the carrying arm 4 is ready for a transfer operation, and a signal provided upon the delivery of a wafer W from the transfer module TRSa is a ready for transfer signal indicating that the transfer device 24 is ready for a transfer operation. Therefore, the transfer device 24 and the carrying device 4 can decide on the basis of those ready for transfer signals that a wafer W can be carried from which module to which module. Thus a carrying operation is determined on the basis of the decision and the foregoing rules.

Operations relating to the inspection station 40 will be described. FIG. 5 is a table showing wafers W placed in the transfer modules TRSc and TRSd and the inspection modules E1, E2 and E3 in carrying cycles. Numerals shown in FIG. 5 are ordinal numerals assigned to wafers W for managing processes. Wafers W are returned from the processing station S1 in order of those ordinal numerals and a delivered to the inspection station 40 in order of those ordinal numerals. Numerals in the uppermost row in the table shown in FIG. 5 are ordinal numerals assigned to wafers W held in the cassette C. In other words, the table shows a carrying schedule when the table is read along columns and the numerals in the uppermost rows can be read as cycle numbers.

In the following description, the numerals in the uppermost row are regarded as cycle numbers. In a cycle #1, wafers W are not placed in any one of the modules TRSc, TRSd, E1, E2 and E3.

In a cycle #2, the wafer #1 is placed in the transfer module TRSc because the transfer arm 24 can accomplish a carrying operation relating to inspection once in one carrying cycle.

In cycle #3, the carrying device 4 carries the wafer #1 from the transfer module TRSc to the inspection module E1, and then the transfer arm 24 places a wafer #2 in the transfer module TRSc.

In the cycle #3, the carrying device 4 carries the wafer #2 from the transfer module TRSc to the inspection module E2, and then the transfer device 24 places a wafer #3 in the transfer module TRSc. During this time, the inspection module E1 does not complete the inspection of the wafer #1 and hence the wafer #1 is held in the inspection module E1.

In a cycle #5, the carrying device 4 carries the wafer #3 from the transfer module TRSc to the inspection module E3, and then caries the inspected wafer #1 from the inspection module E1 to the transfer module TRSd. The transfer device 24 delivers a wafer #4 to the transfer module TRSc.

Thus carrying cycles are performed in due order. In a cycle #27, wafers #9 and #10 are under inspection in the inspection modules E3 and E2, respectively, while the inspection of a wafer #11 by the inspection module E1 has been completed. In this case, the wafer #11 is transferred from the inspection module E1 to the transfer module TRSd before the inspections of the wafers #9 and #10 are completed. Subsequently, a wafer #12 is transferred from the transfer module TRSc to the inspection module E1 and, at the same time, a wafer #13 is placed in the transfer module TRSd.

Figure 7A:
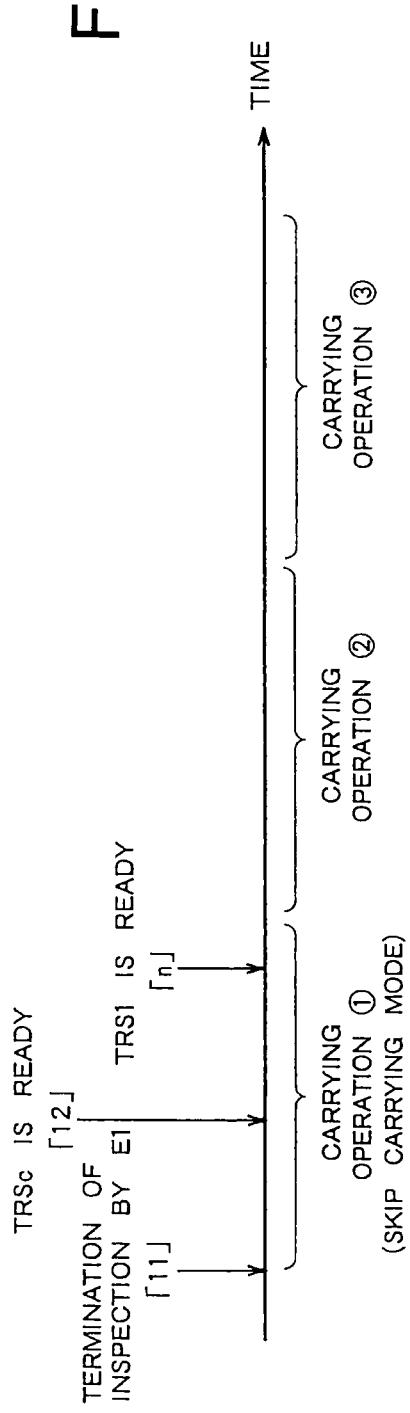
FIG. 7 is a diagrammatic view of assistance in explaining the relation between ready signals provided by inspection modules and transfer modules and the movement of substrates in one cycle of operation specified by the foregoing carrying schedule.
Figure 7B:
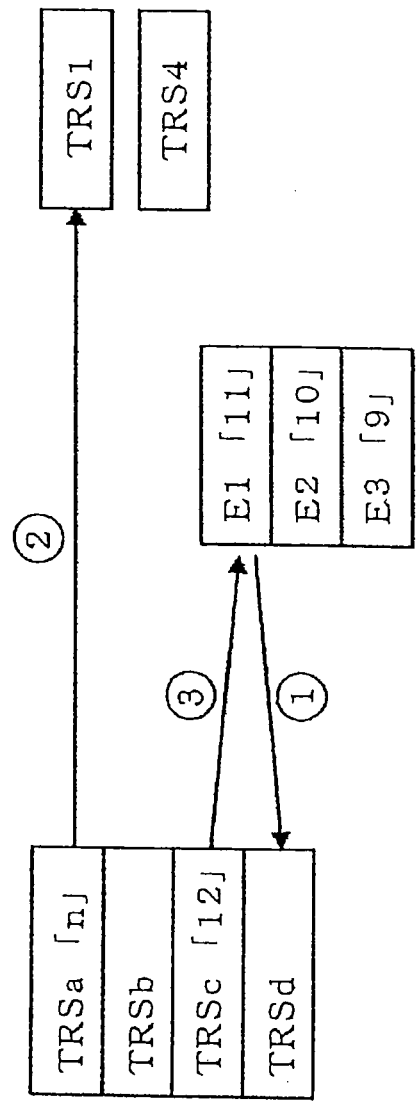

FIGS. 7A and 7B show ready signals provided in the cycle #27 and carrying routes on which wafers are carried in the cycle #27 to explain control operations for controlling the carrying device 4. When the inspection module E1 provides an inspection completion signal (ready for delivery signal), the carrying device 4 carries the wafer #11 to the transfer module TRSd. When the transfer module TRSc provides a ready for delivery signal and the transfer module TRSc provides a ready for receiving signal while the wafer #11 is being carried, a wafer #n is carried preferentially from the transfer module TRSa to the transfer module TRS1 because priority is given to carrying a wafer from the cassette station 21 to the processing station S1, and then the wafer #12 is carried from the transfer module TRSc to the inspection module E1.

FIG. 6 shows a carrying schedule when the wafers are not carried to and carried out from the inspection modules E1, E2 and E3 in the skip carrying mode, in which the present invention carries the wafers, and are carried in the order of the ordinal numerals. For example, although the inspection of a wafer #11 has been completed in a cycle #31, the wafer #11 is held uselessly in the inspection module E1 until a cycle #39 for a long time. Whereas the coating and developing system of the present invention performs forty-six carrying cycles to process a wafer #22 by a series of processes and to return the same to the cassette C, sixty-one carrying cycles need to be performed to process the wafer #22 by the same series of processes and to return the same to the cassette C if the wafers are not carried in the skip carrying mode.

In the foregoing embodiment, the wafers specified by smaller ordinal numerals are carried out earlier from the inspection module E1 (E2, E3) than those specified by larger ordinal numerals; that is, the wafers can be carried out from the inspection module E1 (E2, E3) in the skip carrying mode. Therefore, time for which the inspected wafer is held uselessly in the inspection module E1 (E2, E3) can be reduced and the throughput (productivity) can be increased. Since carrying the wafers to the inspection module E1 (E2, E3) in the skip carrying mode is inhibited, a problems of changing recipes which is necessary when the first wafer of a succeeding lot is delivered to the inspection module before the last wafer of a preceding lot does not arise.

The cooling modules for cooling a wafer and the heating modules for heating a wafer may be used also as transfer modules for transferring wafers from the cassette station 21 to the processing station S1 in addition to the transfer modules. In such a case, the processing modules serve also as the transfer module TRS1. As mentioned in the description of the control of the carrying arm 4, a wafer W needs to be transferred to the inspection module E1 (E2, E3) within a time remaining after subtracting a carrying time in which the wafer W is carried from the cassette station 21 to the processing station S1 and a carrying time in which the wafer W is received from the processing station S1 from the cycle time because a processing time for processing the wafer W, namely, a holding time for which the wafer W held in the transfer module TRS1, is determined.

It is necessary to determine, before executing this operation, whether or not a time point when a transfer operation for transferring a wafer W from the transfer module TRSa to the transfer module TRS1 will be delayed behind a time point when the cycle time terminates if this operation is executed. If it is expected that the time point when the transfer operation for transferring the wafer W from the transfer module TRSa to the transfer module TRS1 is delayed behind the time point when the cycle time terminate, the carrying device 4 needs to be controlled so that any wafer W is transferred to the inspection module E1 (E2, E3). If a wafer W is transferred to the inspection module E1 (E2, E3), a holding time (processing time) for which the next wafer W is held in the transfer module TRS1 is shorter than a predetermined time.

Figure 8:
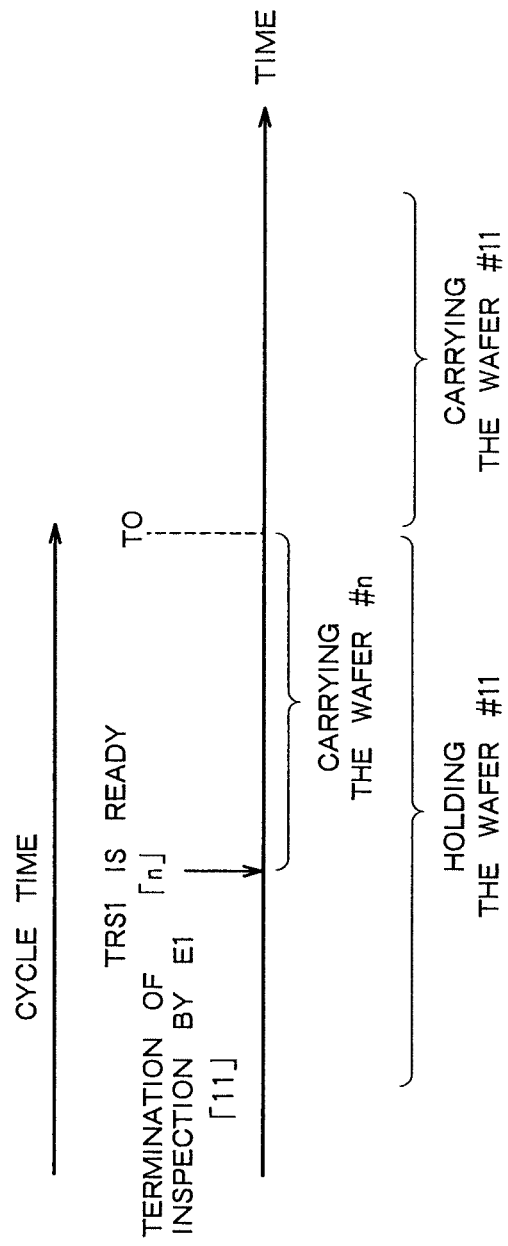
FIG. 8 is a diagrammatic view of assistance in explaining the relation between ready signals provided by inspection modules and transfer modules and the movement of substrates in one cycle of operation specified by the foregoing carrying schedule.
Figure 9:
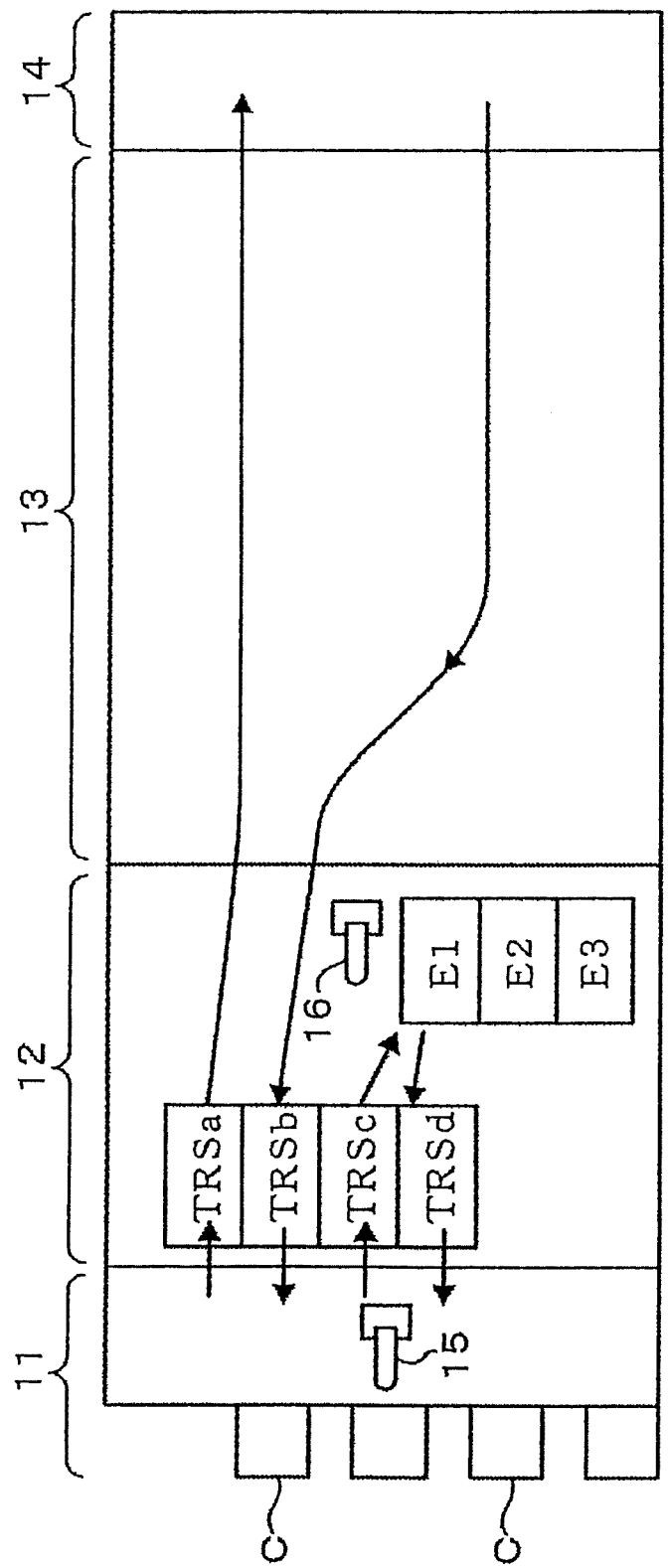
FIG. 9 is a diagrammatic view of assistance in explaining the flow of a substrate in a known coating and developing system.

FIG. 8 is a diagrammatic view of assistance in explaining the foregoing operating mode. In FIG. 8, $T_0$ indicates a time point when a cycle time of a carrying cycle terminates. The controller 200 makes an inquiry to see whether or not the time between a time point when the inspection module E1 becomes ready for sending out the wafer #11 and the time point $T_0$ is twice an operating time of 5 s needed by the carrying device 4. If the time is less than the operating time, the controller 200 withholds the operation for carrying out the wafer #11 from the inspection module E1. Consequently, the succeeding wafer #n is carried from the transfer module TRSa to the transfer module TRS1 immediately after the preceding wafer has been carried out from the transfer module TRS1 (for example, the cooling module). Subsequently, the carrying device 4 carries the wafer #11 from the inspection module E1 to the transfer module TRSd.

According to the present invention, all or some selected ones of the wafers contained in the cassette C may be inspected. Wafers contained in a cassette delivered for inspection from an external system to the cassette table 22 of the coating and developing system may be carried by the transfer device 24 and the carrying device 4 in the foregoing manner and may be inspected by the inspection module E1 (E2, E3) instead of inspecting the wafers processed in the processing station S1 and returned to the cassette C.

Although the invention has been described in its preferred embodiment with a certain degree of particularity, obviously many changes and variations are possible therein. It is therefore to be understood that the present invention may be practiced otherwise than as specifically described herein without departing from the scope and spirit thereof.

What is claimed is:

1. A coating and developing system control method of controlling a coating and developing system comprising:
    a cassette station for holding cassettes each containing a plurality of substrates, the cassette station including a transfer means configured to take out one or more of the plurality of substrates from the cassette station and return the one or more plurality of substrates to the cassette station;
    a processing station provided with a plurality of processing modules, each processing module configured to carry out a process for forming a resist film on a surface a substrate of the plurality of substrates taken out from the cassette, a process for developing the resist film and processes to be carried out before and after the process for developing the resist film, and a first substrate carrying means for carrying one or more substrates of the plurality of substrates on a circulation route in a predetermined cycle time; and
    an inspection station provided with a plurality of inspection modules for inspecting a group of inspection substrates by different inspections requiring different inspection times, respectively, and a second substrate carrying means,
    the group of inspection substrates being a part of the plurality of substrates already processed in the processing station or a plurality of external substrates delivered to the cassette station from an external system to the coating and developing system for inspection,
    each inspection substrate of the group of inspection substrates being beforehand assigned to be inspected by any of the plurality of inspection modules,
    the second substrate carrying means configured to carry a substrate of the plurality of substrates to be processed from the cassette station to the processing station, and carry a substrate of the plurality of substrates already processed from the processing station to the cassette station,
    the second substrate carrying means configured to carry an inspection substrate of the group of inspection substrates to be inspected from the cassette station to the inspection module, and carry an inspection substrate already inspected from the inspection module to the cassette station;
    said coating and developing system control method comprising the steps of;
    making the second substrate carrying means carry either of a substrate to be processed or a substrate already processed, preferentially between the cassette station and the processing station rather than carrying an inspection substrate to and from the inspection modules, when a ready signal indicating the completion of preparation for carrying a substrate to be processed to the processing station from the cassette station is provided or a ready signal indicating the completion of preparation for carrying a substrate already processed to the cassette station from the processing station is provided;
    making the second substrate carrying means carry each inspection substrate of the group of inspection substrates to be inspected from the cassette station to the inspection modules in order of ordinal numerals assigned to each substrate; and
    making the second substrate carrying means carry out each inspection substrate already inspected from the inspection modules to the cassette station regardless of the order of the ordinal numerals assigned to each substrate.

2. The coating and developing system control method according to claim 1, further comprising first and second transfer modules, each of the first and second transfer modules configured to transfer a substrate between the transfer means of the cassette station and the second substrate carrying means, further comprising the steps of:
    transferring a substrate processed in the processing station to the cassette by the transfer means;
    transferring an inspection substrate to be inspected taken out from the cassette to the first transfer module; and
    transferring an inspection substrate already inspected from the second transfer module to the cassette by the transfer means.

3. The coating and developing system control method according to claim 2, wherein an inspection substrate to be inspected taken out from the cassette to the first transfer module is an external substrate taken out from a cassette delivered from the external system to the coating and developing system for inspection.

4. The coating and developing system control method according to claim 3, wherein the transfer means of the cassette station can transfer the external substrate only once to either of the first and the second transfer module in the cycle time.

5. The coating and developing system control method according to claim 3, wherein a substrate to be processed taken out from the cassette station is carried to the processing module of the processing station by the second substrate carrying means, and the step of transferring an inspection substrate to be inspected to the inspection module is completed within a time remaining after subtracting a carrying time in which a substrate to be processed is carried from the cassette station to the processing station and a carrying time in which a substrate already processed is received from the processing station and carried from the cycle time.

6. The coating and developing system control method according to claim 2, wherein an inspection substrate to be inspected taken out from the cassette station to the first transfer module is a part of the plurality of substrates already processed in the processing station.

7. The coating and developing system control method according to claim 6, wherein the transfer means of the cassette station can transfer a substrate to be processed or a substrate already processed only once in the cycle time to either of the first and the second transfer module.

8. The coating and developing system control method according to claim 6, wherein a substrate to be processed taken out from the cassette station is carried to the processing module of the processing station by the second substrate carrying means, and
   the step of transferring an inspection substrate to be inspected to the inspection module is completed within a time remaining after subtracting a carrying time in which a substrate to be processed is carried from the cassette station to the processing station and a carrying time in which a substrate already processed is received from the processing station and carried from the cycle time.

9. The coating and developing system control method according to claim 2, wherein the transfer means of the cassette station can transfer a substrate already processed only once in the cycle time to either of the first and the second transfer module.

10. The coating and developing system control method according to claim 2, wherein a substrate to be processed taken out from the cassette station is carried to the processing module of the processing station by the second substrate carrying means, and
    the step of transferring an inspection substrate to be inspected to the inspection module is completed within a time remaining after subtracting a carrying time in which a substrate to be processed is carried from the cassette station to the processing station and a carrying time in which a substrate already processed is received from the processing station and carried from the cycle time.

11. The coating and developing system control method according to claim 1, wherein a substrate to be processed taken out from the cassette station is carried to the processing module of the processing station by the second substrate carrying means, and
    the step of transferring an inspection substrate to be inspected to the inspection module is completed within a time remaining after subtracting a carrying time in which a substrate to be processed is carried from the cassette station to the processing station and a carrying time in which a substrate already processed is received from the processing station and carried from the cycle time.

* * * * *